United States Patent
Oberg et al.

(10) Patent No.: US 8,046,670 B1
(45) Date of Patent: *Oct. 25, 2011

(54) METHOD AND APPARATUS FOR DETECTING VITERBI DECODER ERRORS DUE TO QUASI-CATASTROPHIC SEQUENCES

(75) Inventors: Mats Oberg, Cupertino, CA (US); Daniel Mumford, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 818 days.

This patent is subject to a terminal disclaimer.

(21) Appl. No.: 12/156,040

(22) Filed: May 29, 2008

Related U.S. Application Data

(63) Continuation of application No. 11/516,272, filed on Sep. 6, 2006, now Pat. No. 7,383,488, which is a continuation of application No. 10/393,640, filed on Mar. 21, 2003, now Pat. No. 7,107,514.

(60) Provisional application No. 60/406,259, filed on Aug. 27, 2002.

(51) Int. Cl.
*H03M 13/00* (2006.01)

(52) U.S. Cl. ........ 714/795; 714/796; 714/794; 375/346; 375/262; 375/265; 375/233

(58) Field of Classification Search .................. 714/794, 714/796; 375/346, 265, 233
See application file for complete search history.

(56) References Cited

U.S. PATENT DOCUMENTS

| | | | |
|---|---|---|---|
| 4,669,084 A * | 5/1987 | Hartman et al. | 714/786 |
| 6,212,664 B1 | 4/2001 | Feygin et al. | |
| 6,302,576 B1 | 10/2001 | Ono et al. | |
| 6,351,781 B1 | 2/2002 | Gracias et al. | |
| 6,452,984 B1 | 9/2002 | Banister et al. | |
| 6,604,124 B1 | 8/2003 | Archbold | |
| 6,934,345 B2 | 8/2005 | Chu et al. | |
| 7,107,514 B1 | 9/2006 | Oberg et al. | |
| 7,383,488 B1 * | 6/2008 | Oberg et al. | 714/795 |
| 7,383,489 B1 * | 6/2008 | Oberg et al. | 714/795 |

FOREIGN PATENT DOCUMENTS

WO   WO 00/70614   11/2000

OTHER PUBLICATIONS

Cheung et al. Soft-decision feedback equalizer for continuous phase modulated signals in wideband mobile radio channels,' IEEE Transactions on Communications, Feb. 1994; vol. 42, Issue: 234, Part 3; on pp. 1628-1638.
Boyle et al. 'A catastrophic error mode in adaptive predictive DIR equalisation of dynamic channels,' IEEE Workshop on Signal Processing Systems, Sep. 26-28, 2001 pp. 177-184.

* cited by examiner

*Primary Examiner* — Guy Lamarre

(57) ABSTRACT

A Viterbi decoder includes an early decision generator that generates an early decision output. An error detector detects errors in the early decision output and generates a signal when the early decision output errors are detected.

16 Claims, 11 Drawing Sheets

METHOD AND APPARATUS FOR DETECTING VITERBI DECODER ERRORS DUE TO QUASI-CATASTROPHIC SEQUENCES

CROSS-REFERENCE TO RELATED APPLICATIONS

This application is a continuation of U.S. patent application Ser. No. 11/516,272, filed Sep. 6, 2006 (now U.S. Pat. No. 7,383,488) which is a continuation of U.S. patent application Ser. No. 10/393,640 filed Mar. 21, 2003 (now U.S. Pat. No. 7,107,514), which claims the benefit of U.S. Provisional Application No. 60/406,259, filed Aug. 27, 2002. The disclosures of the above applications are incorporated herein by reference in their entirety.

FIELD OF THE INVENTION

The present invention relates to communications channels with forward error correction (FEC), and more particularly to communications channels that include Viterbi decoders.

BACKGROUND OF THE INVENTION

As data storage densities and data transmission rates increase, the ability of hardware devices to correctly recognize binary data diminishes. Many communications systems perform forward error correction (FEC) to improve data transmission accuracy and to ensure data integrity. FEC helps reduce bit error rates (BER) in applications such as data storage, digital video broadcasts, and wireless communications.

Convolutional coding and block coding are two forms of FEC. Block coding typically adds redundant bits to a message. For example, parity bits are added to ensure an even sum. If an odd sum is received, an error is detected. In convolutional coding, a transmitted stream is generated from an input stream. A Viterbi decoder is used to decode the received stream to identify a most probable transmitted stream, which is used to recover the input stream.

Referring now to FIG. 1, a first device 10-1 communicates with a second device 10-2 over a communications channel 12. As can be appreciated, the devices 10-1 and 10-2 are simplified for discussion purposes. Additional signal processing is typically performed before and/or after the convolutional encoding and/or Viterbi decoding.

The communications channel can be hardwired or wireless. For example, the communications channel 12 can be an Ethernet network, a wireless local area network, a bus for a hard drive, etc. The first device 10-1 includes components 14-1 that provide an input stream to a convolutional encoder 16-1 and that receive a decoded stream from a Viterbi decoder 18-1. Likewise, the device 10-2 includes components 14-2 that provide an input stream to a convolutional encoder 16-2 and that receive a decoded stream from a Viterbi decoder 18-2. The components 14-1 of the first device 10-1 may be similar to and/or different than the components 14-2 of the second device 10-2. The convolutional encoders 16 transform the input stream into a transmitted stream before the data is output onto the communications channel 12. The Viterbi decoders 18 decode the received stream to recover a most probable transmitted stream.

For example, a rate-½ convolutional code transmits 2 output bits for each input bit. Referring now to FIG. 2, a trellis 20 is typically used to generate the rate-½ convolutional code. The trellis 20 includes four states (00, 01, 10 and 11). At each point, the trellis 20 splits into two paths. An upper path represents a 0 input and a lower path represent a 1 input. An initial state of 00 is presumed. Using the trellis 20 in FIG. 2, an input stream of 1101 generates an output of 11101101. In other words, the MSB of the input stream (1) corresponds to 11 in the transmitted stream. The $2^{nd}$ MSB of the input stream (1) corresponds to 10 in the transmitted stream. The $3^{rd}$ MSB of the input stream (0) corresponds to 11 in the transmitted stream. The LSB of the input stream (1) corresponds to 01 in the transmitted stream.

A received stream must be decoded. Some decoders use a Viterbi algorithm to decode the received stream. The Viterbi algorithm compares the received stream to all possible transmitted streams and selects the transmitted stream that is closest to the received stream. The transmitted stream that is selected by the Viterbi algorithm has a minimum number of bits that are different from the received stream—or a minimum bit distance. Once the most probable transmitted stream is identified, the input stream is generated from the selected trellis path.

Referring now to FIG. 3, to decode an input sequence of 10101010, a trellis 24 is used. The distance between each pair of received bits and the corresponding bits in the trellis 24 (or possible transmitted bits) are identified. For example, the 1 on the path AB results from the comparison of the received bits 10 to the bits 00 on the AB path. The received bits 10 differ from the trellis bits 00 for AB by one bit position.

If there are two paths that end at the same point or state, the Viterbi decoder selects the path with the minimum bit distance. If the two paths have the same distance, either path can be selected. In other words, the probability of decoding is the same for each path. In this particular example, the path through ACGJL in the trellis 24 has a bit distance of 2. The path ACGJL is generated by an input of 1100. The input of 1100 into the trellis 20 in FIG. 2 would correspond to an output of 11101110, which also has a bit distance of 2 from the received word. While a rate-½ convolutional code was shown, other rate convolutional codes may be used by Viterbi decoders.

Some conventional Viterbi decoders provide both a full decision output and an early decision output. The early decision output may be used by one or more control loops such as baseline loops, timing loops, gain loops and finite impulse response (FIR) adaptation loops. The early decision output may be used by the control loops to generate error signals. If the early decision output is incorrect, these control loops will cause errors. Therefore, the Viterbi decoder should not output the early decision output to these control loops when the early decision output is incorrect.

For example, for magnetic recording equalization targets containing a (1+D) factor, quasi-catastrophic sequences correspond to runs of alternating 1's and 0's that exceed a path memory depth of the Viterbi decoder that is matched to the equalization target. For equalization targets with a (1+D) factor, bit sequences with long transition runs can cause problems with the early decision output. For example, a sequence +−+−+−+−+−+−+−+−+− can be decoded to either +−+−++−+−+−+−+−+−+ or ++−++++−+−+−+−+−+−+−. For an all positive target, e.g. $4+6D+3D^2+2D^3+1\ D^4$, an output of a reconstruction filter can be either ?,?,?,0,0,0,−8,−12,−14,−16,−8,−4,−2,0,0,0,0,0 or ?,?,?,0,0,8,12,14,16,8,4,2,0,0,0,0,0 instead of ?,?,?,0,0,0,0,0,0,0,0,0,0,0,0,0,0. This incorrect early decision output would adversely impact the performance of the control loops that use the early decision output.

The Viterbi decoder makes the early decision errors when there is a tie between two different paths that have the same path metric value or bit distance. The tie is broken by deterministically selecting one best path over the other based on the current state of the path. A path is denoted as follows:

$$(u_F, u_{F-1}, \ldots, u_E, u_{E-1}, \ldots, u_1, u_0); m$$

where index F denotes the full decision depth. Index E denotes the early decision depth. Each variable $u_i \in (-1,1)$ denotes a bit in the Viterbi path memory and m is the path metric value for the path. The current state of the path for a 16 state trellis is given by bits $u_0, u_1, u_2, u_3$.

For example, using equalization target $H(D)=(1+D)G(D)$, there is a tie in the path metric between the two best paths $P_A$ and $P_B$ at time i:

$$P_A=(?,?,\ldots,?,+1,-1,+1,-1,+1,-1,+1,-1,\underline{+1},-1,+1,-1,+1,-1,+1,-1,+1,-1,+1); m$$

$$P_B=(?,?,?,-1,+1,-1,+1,-1,+1,-1,+1,\underline{-1},+1,-1,+1,-1,+1,-1,+1,-1,+1,-1); m$$

The underscored bits represent the early decision output for respective paths $P_A$ and $P_B$. If the Viterbi decoder at time i selects path $P_A$ as the winner, then the early decision output is $x_i=1$.

For time i+1, the winning branch for path $P_A$ corresponds to −1 and the winning branch for path $P_B$ corresponds to +1. At time t=i+1, the paths $P_A$ and $P_B$ are as follows:

$$P_{A,i+1}=(?,?,\ldots,?,+1,-1,+1,-1,+1,-1,+1,-1,+1,\underline{-1},+1,-1,+1,-1,+1,-1,+1,-1,+1,-1); m$$

$$P_{B,i+1}=(?,?,\ldots,?,-1,+1,-1,+1,-1,+1,-1,+1,-1,\underline{+1},-1,+1,-1,+1,-1,+1,-1,+1,-1,+1); m$$

Since the two paths $P_A$ and $P_B$ were tied at time i and the branch metrics for each path are equal, the paths $P_A$ and $P_B$ will be tied at time i+1 as well. At time i, the leading state for path $P_A$ was (+1,−1,+1,−1) and the leading state for path for path $P_B$ was (−1,+1,−1,+1). At time 1+1, however, the leading state for path $P_A$ is (−1,+1,−1,+1) and the leading state for path $P_B$ is (+1,−1,+1,−1).

Since the Viterbi decoder selected the path with leading state (+1,−1,+1,−1) when there was a tie between the two at time i, the Viterbi decoder will do the same at time t=i+1. Therefore, the path $P_B$ will be the winner at time i+1 and the early decision output will be $x_{i+1}=1$. If this continues for a few cycles, the output sequence would be +1,+1,+1,+1,+1 for this segment. However, the correct output sequence should be +1,−1,+1,−1,+1.

SUMMARY OF THE INVENTION

A Viterbi decoder includes an early decision generator that generates an early decision output. An error detector detects errors in the early decision output and generates a disable signal when the early decision output errors are detected.

In other features, a secondary early decision generator generates a secondary early decision output. The error detector includes a comparing circuit that disables a prior early decision output if the secondary early decision output is different than the prior early decision output. The comparing circuit includes a delay circuit that delays the early decision output to provide the prior early decision output. The comparing circuit further includes an XOR gate that includes a first input that receives the secondary early decision output and a second input that receives the prior early decision output.

In yet other features, a reconstruction filter and error signal generator communicates with the Viterbi decoder and generates error signals. A hold circuit communicates with the error detector and disables the error signals until the early decision output with errors passes out of the reconstruction filter and error signal generator. The secondary early decision output includes at least one bit that is temporally closer to the full decision output than the early decision output.

In other features, a best path flag generator generates a best path flag when the Viterbi decoder identifies two best paths having the same path metric. A comparing circuit disables the early decision output if a prior secondary early decision output is different than the early decision output, the best path flag is true and a prior best path flag is true. A reconstructive filter and error signal generator communicates with the Viterbi decoder and generates error signals. A hold circuit communicates with the error detector and disables the error signals until the early decision output with errors passes out of the reconstruction filter and error signal generator. The comparing circuit includes at least one of a delay circuit, an XOR gate and an AND gate.

Another Viterbi decoder according to the present invention identifies errors in a full decision output. A full decision generator generates the full decision output. An error detector that detects errors in said full decision output and that generates a disable signal when said full decision output errors are detected.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
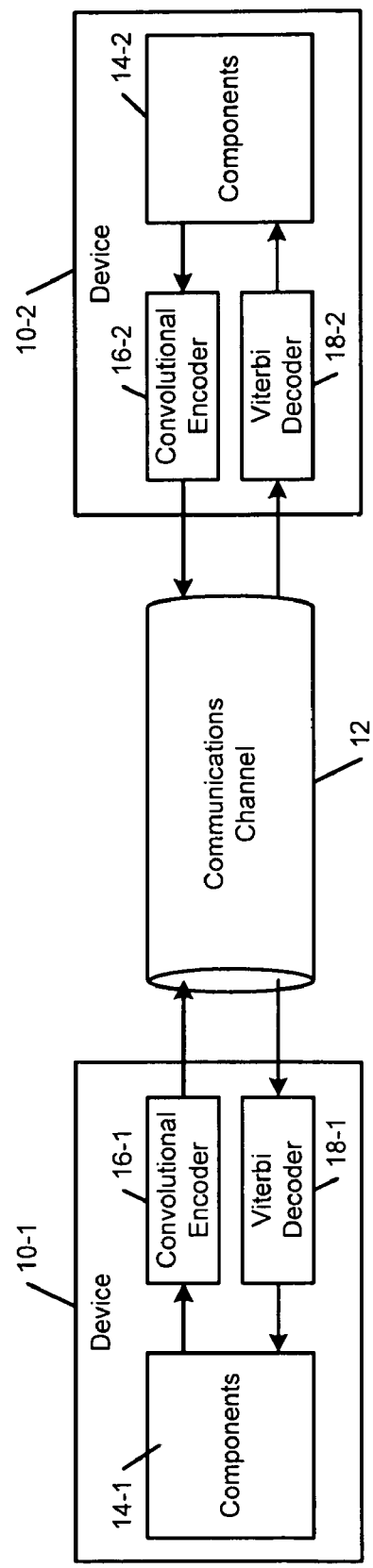
FIG. 1 illustrates a communications channel and devices with Viterbi decoders.
Figure 2:
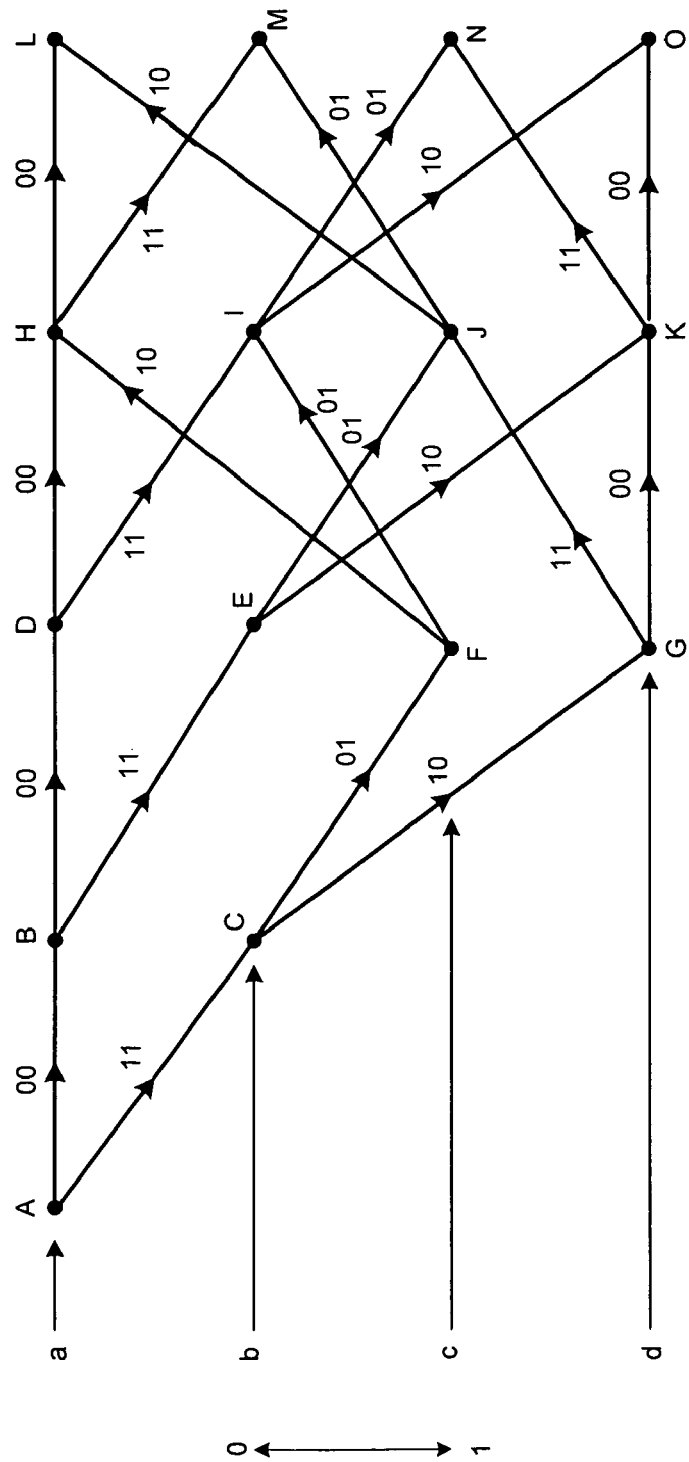
FIG. 2 illustrates a four state trellis for a ½-rate convolutional encoder according to the prior art.
Figure 3:
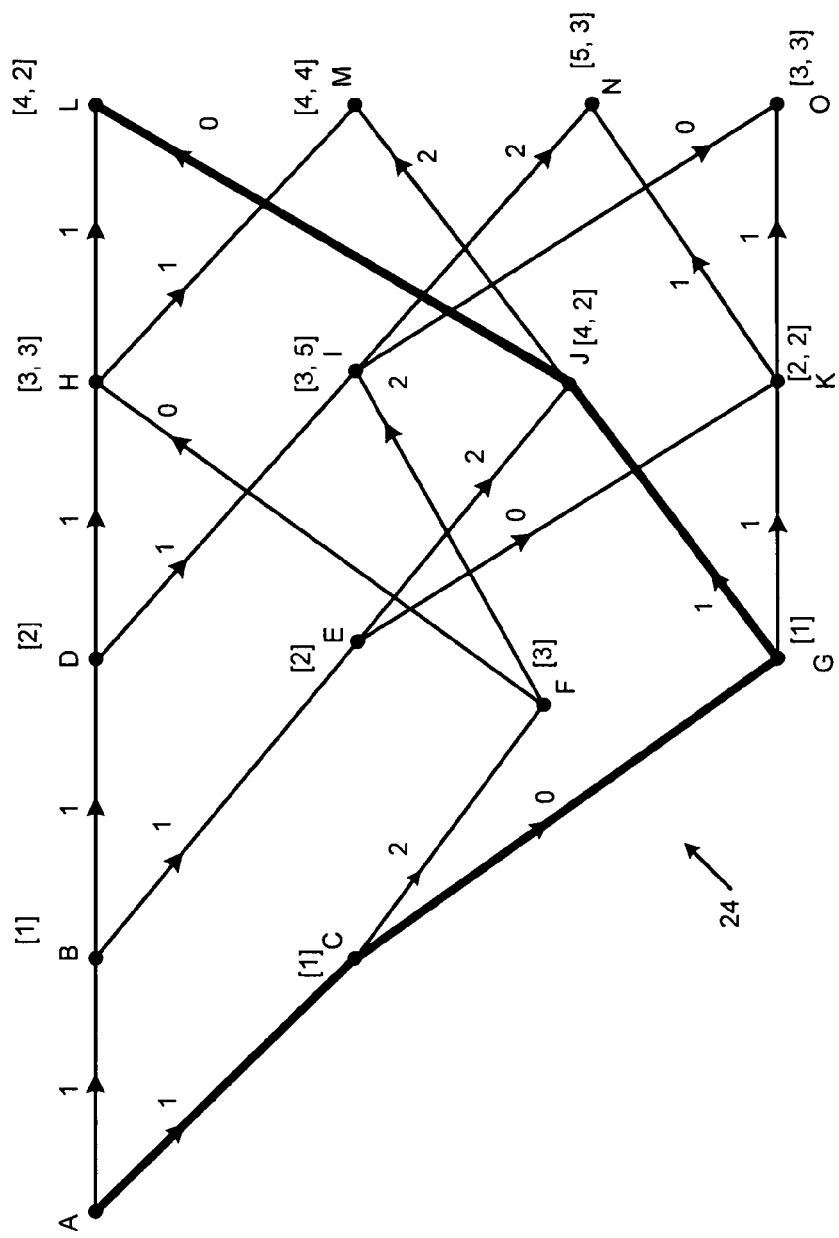
FIG. 3 illustrates a four state trellis used to calculate a minimum distance according to the prior art.

The following description of the preferred embodiment(s) is merely exemplary in nature and is in no way intended to limit the invention, its application, or uses. For purposes of clarity, the same reference numbers will be used in the drawings to identify the same elements.

Figure 4:
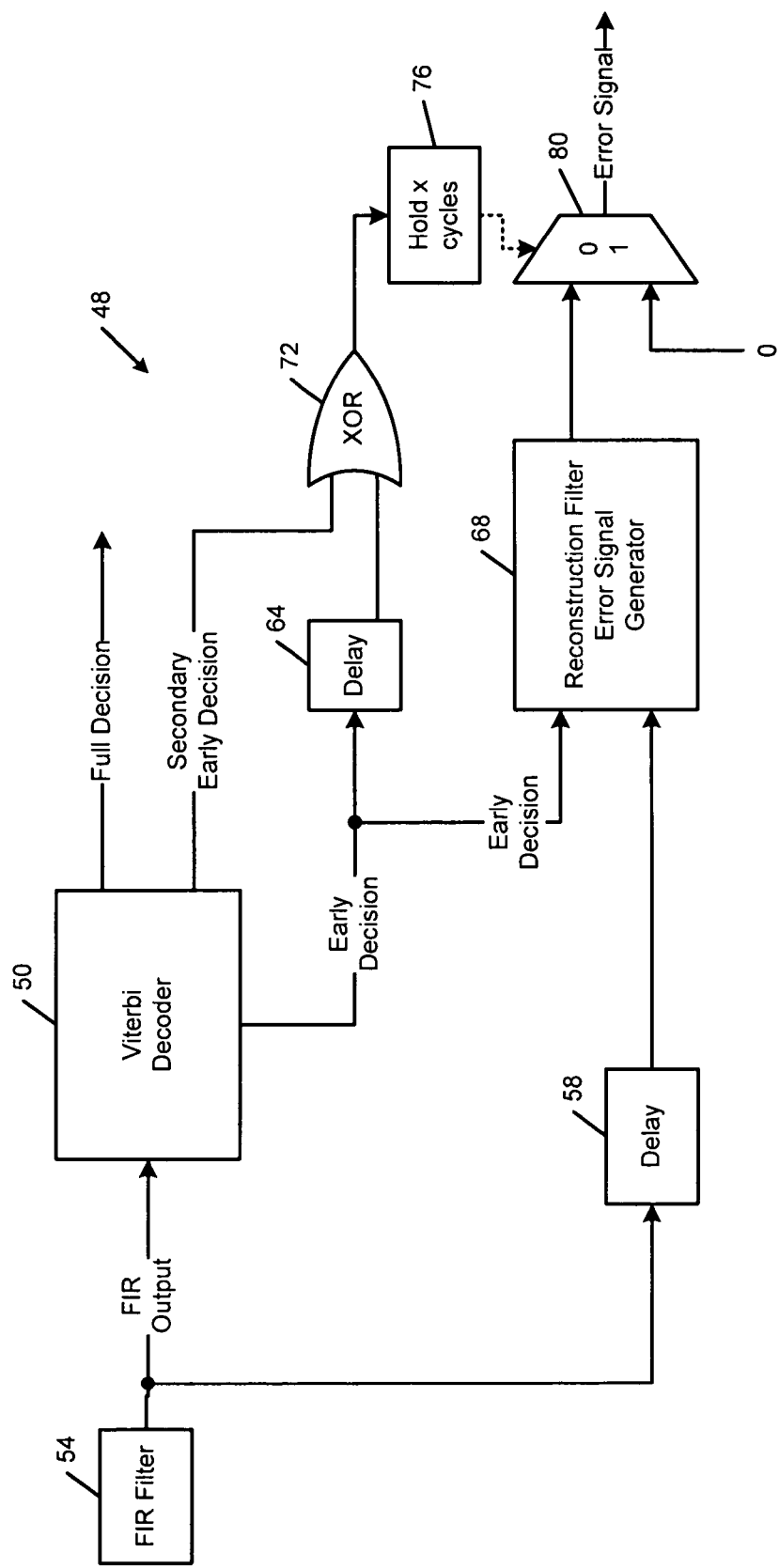
FIG. 4 is a functional block diagram of an early decision output error detector according to the present invention.

Referring now to FIG. 4, a first early decision error detector 48 according to the present invention is shown. A Viterbi decoder 50 receives data from a finite impulse response (FIR) filter 54. The output of the FIR filter 54 is also connected to a delay device 58 that inserts one or more delay units. The delay device 58 may match the delays of the Viterbi decoder 50. The Viterbi decoder 50 provides a full decision output and an early decision output. The Viterbi decoder 50 also generates a secondary early decision output that will be described further below.

The early decision output is transmitted to a delay device 64 and to a reconstruction filter and error signal generator 68, which also receives an output of the delay device 58. The reconstruction filter of the reconstruction filter and error signal generator 68 uses the early decision Viterbi output to reconstruct an ideal noise free Viterbi detector input. For example, if the Viterbi detector 50 is matched to an equalization target H(D), then the reconstruction filter convolves the Viterbi detector output with the equalization target H(D). The error signal generator of the reconstruction filter and error signal generator 68 takes the difference between the reconstruction filter output and the output of the delay device 58.

An output of the delay device 64 is input to an XOR gate 72. The secondary early decision output is also input to the XOR gate 72. An output of the XOR gate 72 is input to a hold circuit 76, which holds the output of the XOR gate 72 for x cycles. The number of cycles x is related to the number of cycles that are required to pass the early decision output with errors out of the reconstruction filter and error signal generator 68.

The output of the hold circuit 76 controls a multiplexer 80, which selects between a 0 input and the output of the reconstruction filter and error signal generator 68. When the output of the hold circuit 76 is high, the multiplexer 80 selects the 0 input to disable error signals that are based on the early decision output. When the output of the hold circuit 76 is low, the multiplexer 80 enables the error signal outputs of the reconstruction filter and error signal generator 68. In other words, when the current secondary early decision output and the prior early decision output do not match, the XOR gate 72 outputs a high signal to the hold circuit 76, which disables the error signal outputs of the reconstruction filter and error signal generator 68. As a result, the bad early decision output will not impact the control loops. The hold circuit 76 continues to disable the early decision output until the effects of the early decision output error pass out of the reconstruction filter and error signal generator 68.

The secondary early decision output is preferably one or more bits temporally closer to the full decision depth than the early decision outputs, although other bits may be used. The secondary early decision output is compared to the prior early decision output. If the second early decision output and the prior early decision output are different, then one of the bits was decoded in error and the prior early decision output is invalid. If the early decision output is used for error signal generation, the error signals that use the invalid early decision output are preferably reset.

The solution will be demonstrated using the same path memories that were used above. In addition to underlining the early decision output, the selected secondary early decision is double underlined. At time t=i, the paths $P_A$ and $P_B$ have the following values:

$$P_{A,i}=(?,?,\ldots,?,+1,-1,+1,-1,+1,-1,+1,\underline{-1},\\ \underline{\underline{+1}},-1,+1,-1,+1,-1,+1,-1,+1,-1,\overline{+1});m$$

$$P_{B,i}=(?,?,\ldots,?,-1,+1,-1,+1,-1,+1,-1,+1,\\ \underline{\underline{-1}},+1,-1,+1,-1,+1,-1,+1,-1,+1,-1,\overline{-1});m$$

The early decision output is the same as before, $x_i=1$ and the secondary output at time i is $y_i=-1$. At time i+1, the two paths $P_A$ and $P_B$ have the following values:

$$P_{A,i+1}=(?,?,\ldots,?,+1,-1,+1,-1,+1,-1,+1,-1,\underline{+1},\\ \underline{\underline{-1}},+1,-1,+1,-1,+1,-1,+1,-1,-1);m$$

$$P_{B,i+1}=(?,?,\ldots,?,-1,+1,-1,+1,-1,+1,-1,+1,\underline{-1},\\ \underline{\underline{+1}},-1,+1,-1,+1,-1,+1,-1,+1,-1,+1);m$$

As before, the early decision output is $x_{i+1}=1$ and the secondary early decision output is $y_{i+1}=-1$. The current secondary early decision output $y_{i+1}=-1$ is compared to the early decision output from the last clock cycle $x_i=1$. These two outputs should be the same. If the two outputs are different, one of the two bits is erroneous. Therefore, the early decision $x_i$ is declared invalid. If the early decision output is used to generate error signals, the error signals are reset for the number of cycles that the early decision output is used.

Figure 5:
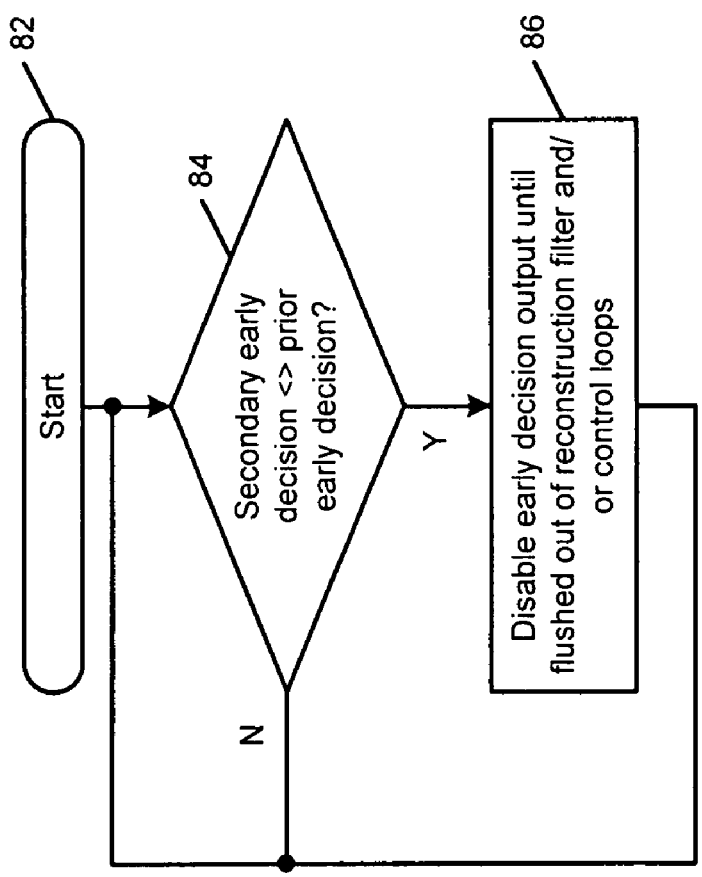
FIG. 5 illustrates steps that are performed by the early decision output error detector in FIG. 4.

Referring now to FIG. 5, steps for identifying early decision output errors are shown. Control begins in step 82. In step 84, the early decision output error detector determines whether the secondary early decision output is different that the prior early decision output. If true, the early decision output error detector disables the early decision output in step 86 until the early decision output error has been flushed from the reconstruction filter and error signal generator 68.

Instead of using a secondary early decision output with path memory that is larger than the early decision output, it is also possible to use a secondary early decision output with a path memory that is smaller than the early decision output. The secondary early decision output is delayed instead of the early decision output before the two outputs are compared. This approach allows the error signal to be reset earlier.

Figure 6:
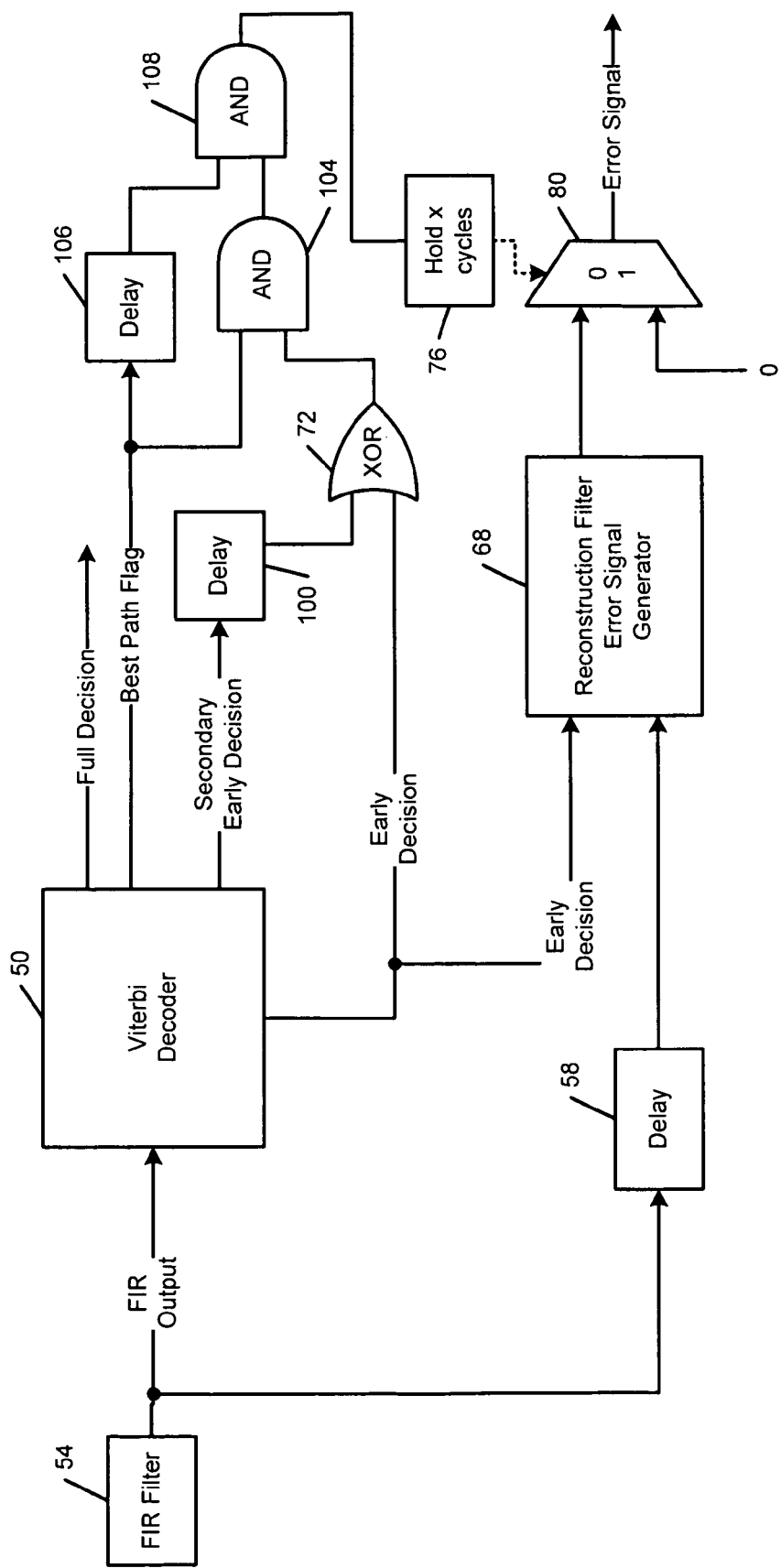
FIG. 6 is a functional block diagram of another early decision output error detector according to the present invention.

Referring now to FIG. 6, the Viterbi decoder 50 may also provide a best path flag in addition to the other outputs described above. The secondary early decision is output to a delay device 100, which has an output that is connected to the XOR gate 72. The early decision output is also connected to the XOR gate 72. An output of the XOR gate is input to an AND gate 104. A second input of the AND gate 104 is connected to the best path flag. The best path flag is also input to a delay device 106. An output of the AND gate is input to an AND gate 108, which has another input that is connected to the delay device 106.

The best path function of the Viterbi decoder 50 selects a specific path only when there is a tie between two states (corresponding to a quasi-catastrophic sequence). Further, the best path flag is high only if the current path that is selected was selected using the best path function. The secondary early decision output in FIG. 6 preferably has a path delay of one less than the early decision output.

A problem arises when there is a tie between the two best path metrics and they both belong to the quasi-catastrophic sequence −+−+−+−+. In this case, the Viterbi decoder 50 will always select the path that ends in a particular state. For example, the two best states are (+−+−) and (−+−+) and there is a tie. The Viterbi decoder 50 may select state (−+−+) using the best path function.

The best path that is selected when there is a tie is denoted as $\hat{P}$. If there is a tie between the states at times i and i+1, the Viterbi decoder 50 will choose the same state as the best state at times i and i+1. This means that there will be a change in the bit sequence. The secondary output is hardwired to path $\hat{P}$ at a path memory depth of one less than that of the early decision output.

It is impossible to know which bit is correct. The incorrect bit will influence the control loops until it passes out of the reconstruction filter and error signal generator 68. Therefore, the error signals generated by the control loops are disabled when this occurs. The loops are disabled by resetting the error signals when the best path at times i and i−1 is $\hat{P}$ and the early decision output at time i is different than the prior secondary early decision (with path memory 1 less than early decision) at time i−1. Since resetting the error signal is conditioned on the best path being $\hat{P}$ at time i−1, the secondary early decision can be hard wired to the bit in the sequence corresponding to path $\hat{P}$.

For a 16 state Viterbi, a 16-1 MUX operation is not required to obtain the error signal output. More generally, for an m-state Viterbi decoder, an m−1 MUX operation is not required, which is normally required to obtain an early decision output from a Viterbi decoder. The best path flag signal goes high when the best path function of the Viterbi decoder selects the path beginning with state $\hat{P}$. The signal can then be used to verify that the secondary early decision output corresponds to the maximum likelihood path at that time. The error detector in FIG. 6 has the benefit of using a secondary early decision with path memory one shorter than the Viterbi decoder.

Figure 7:
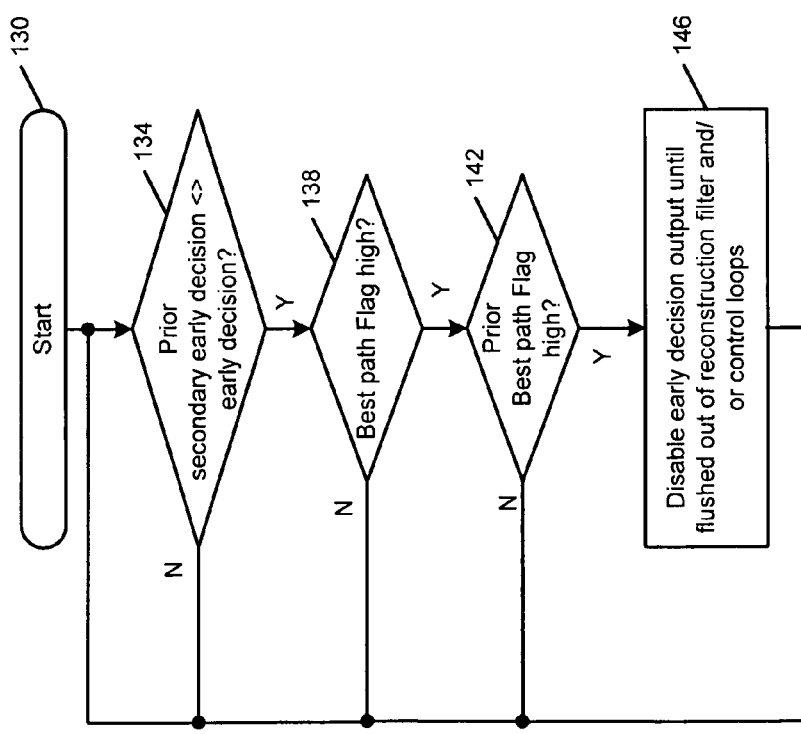
FIG. 7 illustrates steps that are performed by the early decision output error detector in FIG. 6.

Referring now to FIG. 7, steps that are performed by the alternate early decision output error detector are shown. Control begins in step 130. In step 132, the alternate early decision output error detector determines whether the prior secondary early decision output is different than the current early decision output. If true, then the alternate early decision output error detector determines whether the best path flag is high in step 138. If true, then the alternate early decision output error detector determines whether the prior best path flag is high. If true, then the alternate early decision output error detector disables the early decision output until it passes out of the reconstruction filter 68.

Figure 8:
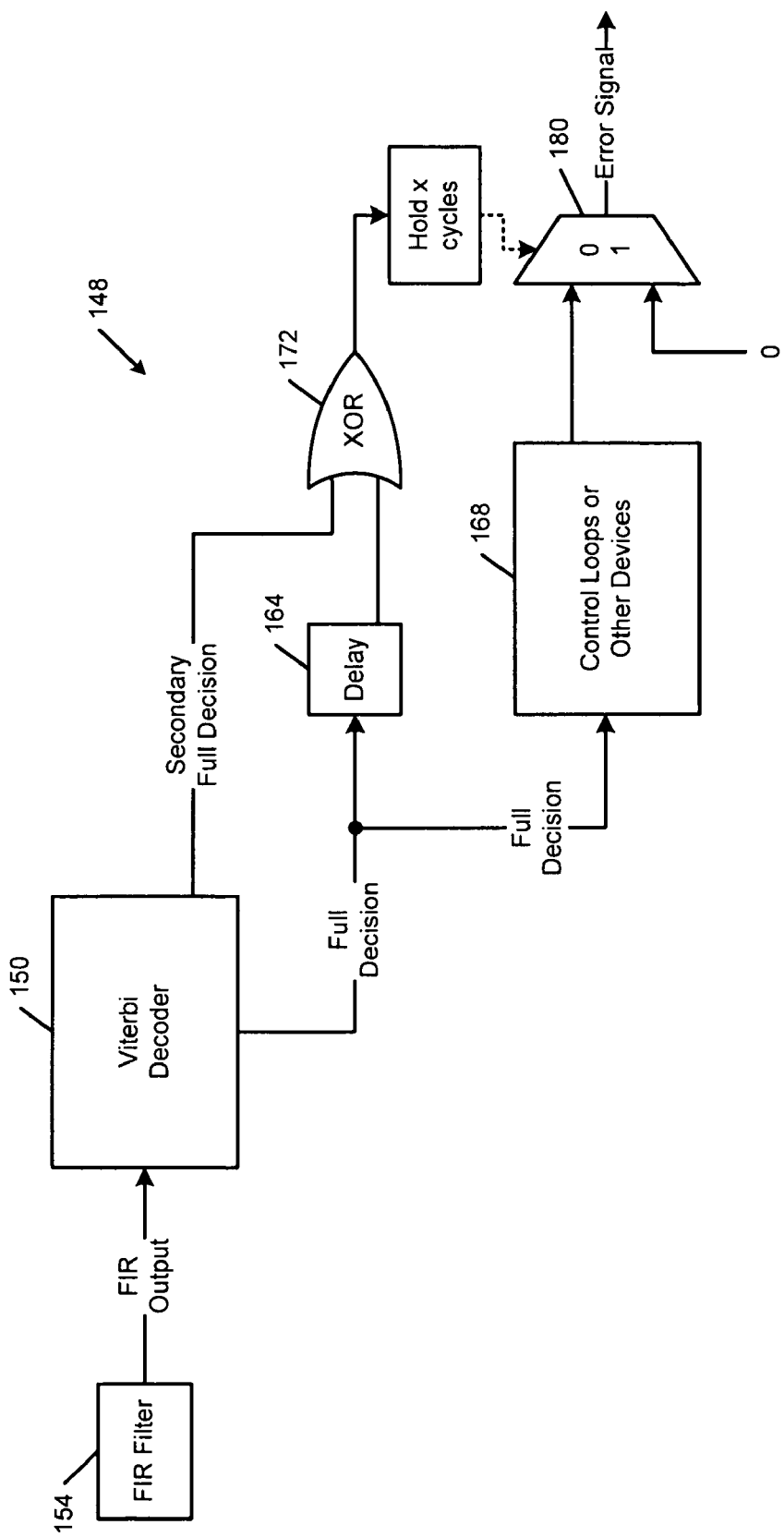
FIG. 8 is a functional block diagram of a full decision output error detector according to the present invention.

Referring now to FIG. 8, a first full decision error detector 148 according to the present invention is shown and has operation that is similar to the early decision error detectors described above. A Viterbi decoder 150 receives data from a finite impulse response (FIR) filter 154. The Viterbi decoder 150 provides a full decision output. The Viterbi decoder 150 also generates a secondary full decision output that will be described further below.

The full decision output is transmitted to a delay device 164 and to control loops or other devices 168. An output of the delay device 164 is input to an XOR gate 172. The secondary full decision output is also input to the XOR gate 172. An output of the XOR gate 172 is input to a hold circuit 176, which holds the output of the XOR gate 172 for x cycles. The number of cycles x is related to the number of cycles that are required to pass the full decision output with errors out of the control loops or other devices 168.

The output of the hold circuit 176 controls a multiplexer 180, which selects between a 0 input and the output of the control loops or other devices 168. When the output of the hold circuit 176 is high, the multiplexer 180 selects the 0 input to disable error signals that are based on the full decision output. When the output of the hold circuit 176 is low, the multiplexer 180 enables outputs of the control loops or other devices 168. In other words, when the current secondary full decision output and the prior full decision output do not match, the XOR gate 172 outputs a high signal to the hold circuit 176, which disables the outputs of the control loops or other devices 168. As a result, the bad full decision output will not have an adverse impact. The hold circuit 176 continues to disable the full decision output until the effects of the full decision output with errors passes out of the control loops or other devices 168.

The secondary full decision output is preferably one or more bits that are temporally older than the full decision depth, although other bits may be used. The secondary full decision output is compared to the prior full decision output. If the second full decision output and the prior full decision output are different, then one of the bits was decoded in error and the prior full decision output is invalid. If the full decision output is used for error signal generation, the error signals that use the invalid full decision output are preferably reset.

Figure 9:
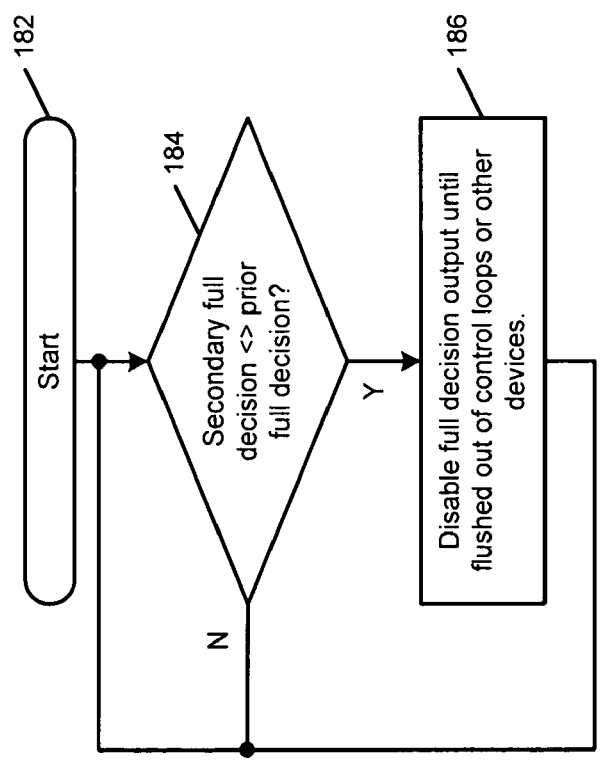
FIG. 9 illustrates steps that are performed by the full decision output error detector in FIG. 8.

Referring now to FIG. 9, steps for identifying full decision output errors are shown. Control begins in step 182. In step 184, the full decision output error detector determines whether the secondary full decision output is different than the prior full decision output. If true, the full decision output error detector disables the full decision output in step 186 until the full decision output error has been flushed from the control loops or other devices 168.

Instead of using a secondary full decision output with path memory that is larger or longer than the full decision output, it is also possible to use a secondary full decision output with a path memory that is smaller than the full decision output. The secondary full decision output is delayed instead of the full decision output before the two outputs are compared. This approach allows the error signal to be reset earlier.

Figure 10:
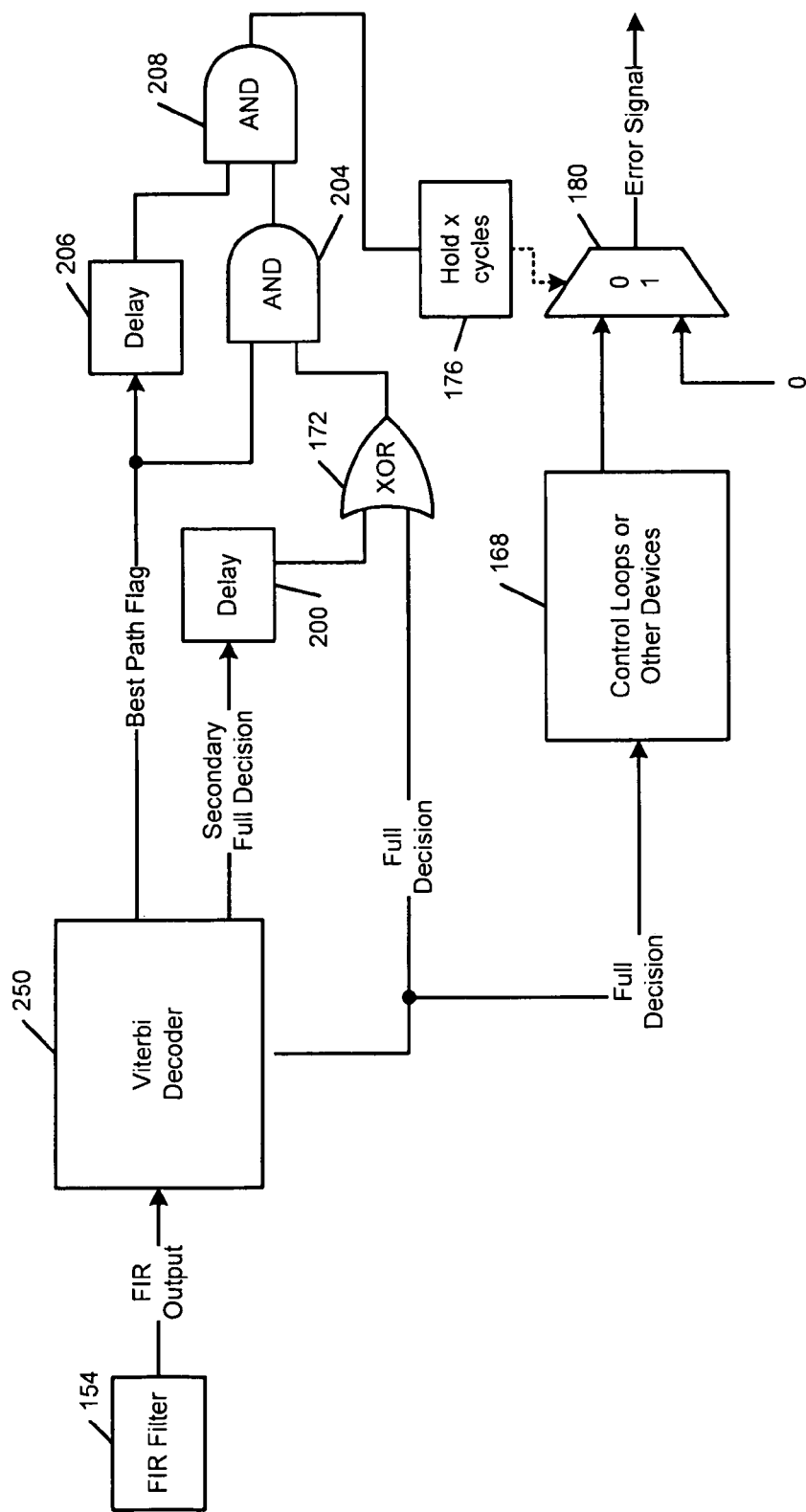
FIG. 10 is a functional block diagram of another full decision output error detector according to the present invention.

Referring now to FIG. 10, the Viterbi decoder 150 may also provide a best path flag in addition to the other outputs described above. The secondary full decision is output to a delay device 200, which has an output that is connected to the XOR gate 172. The full decision output is also connected to the XOR gate 172. An output of the XOR gate is input to an AND gate 204. A second input of the AND gate 204 is connected to the best path flag. The best path flag is also input to a delay device 206. An output of the AND gate is input to an AND gate 208, which has another input that is connected to the delay device 206.

The best path function of the Viterbi decoder 150 selects a specific path only when there is a tie between two states (corresponding to a quasi-catastrophic sequence). Further, the best path flag is high only if the current path that is selected was selected using the best path function. The secondary full decision output in FIG. 10 preferably has a path delay of one less than the full decision output.

Figure 11:
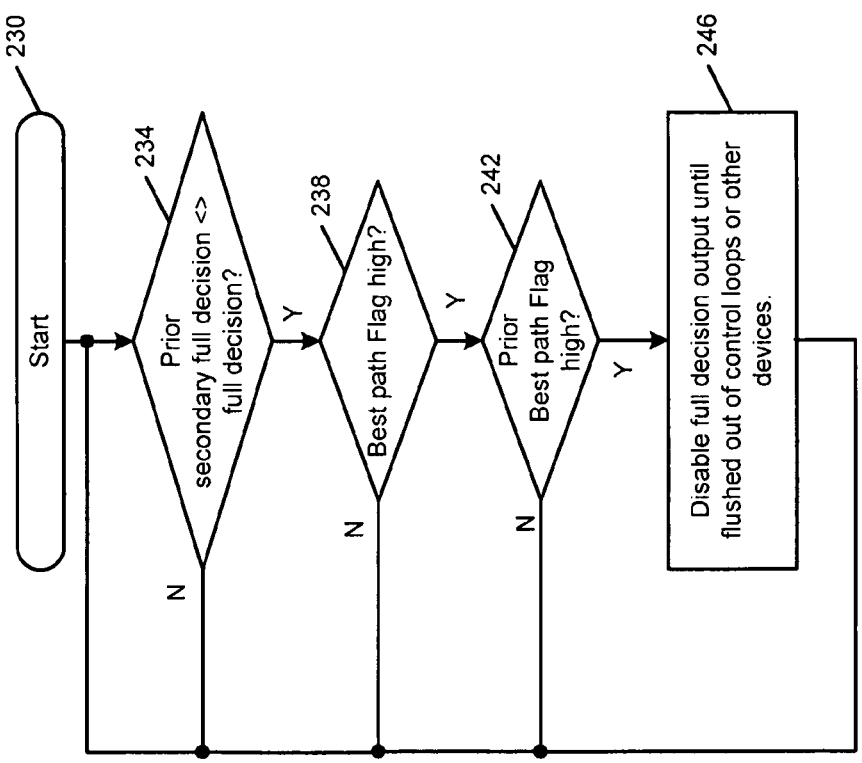
FIG. 11 illustrates steps that are performed by the full decision output error detector in FIG. 10.

Referring now to FIG. 11, steps that are performed by the alternate full decision output error detector are shown. Control begins in step 230. In step 232, the alternate full decision output error detector determines whether the prior secondary full decision output is different than the current full decision output. If true, then the alternate full decision output error detector determines whether the best path flag is high in step 238. If true, then the alternate full decision output error detector determines whether the prior best path flag is high. If true, then the alternate full decision output error detector disables the full decision output until it passes out of the control loops or other devices 168.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A Viterbi decoder comprising:
    early decision generating means for generating an early decision output; and
    error detecting means for detecting errors in said early decision output and for generating a signal when said early decision output errors are detected.

2. The Viterbi decoder of claim 1 further comprising secondary early decision generating means for generating a secondary early decision output.

3. The Viterbi decoder of claim 2 wherein said error detecting means includes comparing means for disabling a prior early decision output when said secondary early decision output is different than said prior early decision output.

4. The Viterbi decoder of claim 3 wherein said comparing means includes delay means for delaying said early decision output to provide said prior early decision output.

5. The Viterbi decoder of claim 1 further comprising:
    reconstruction filter and error signal generating means for communicating with said Viterbi decoder and for generating error signals; and
    holding means for communicating with said error detecting means and for disabling said error signals until said early decision output with errors passes out of said reconstruction filter and error signal generating means.

6. The Viterbi decoder of claim 2 wherein said secondary early decision output includes at least one bit that is temporally closer to a full decision output than said early decision output.

7. The Viterbi decoder of claim 2 further comprising flag generating means for generating a best path flag when said Viterbi decoder identifies multiple best paths having the same path metric.

8. The Viterbi decoder of claim 7 further comprising comparing means for disabling said early decision output when a prior secondary early decision output is different than said early decision output, said best path flag is true and a prior best path flag is true.

9. The Viterbi decoder of claim 8 further comprising:
    reconstructive filter and error signal generating means for communicating with said Viterbi decoder and for generating error signals; and
    holding means for communicating with said error detecting means and for disabling said error signals until said early decision output with errors passes out of said reconstruction filter and error signal generating means.

10. A Viterbi decoder comprising:
    early decision generating means for generating an early decision output;
    secondary early decision generating means for generating a secondary early decision output; and
    error detecting means for detecting errors in said early decision output and that includes comparing means for generating a signal when said secondary early decision output is different than said early decision output.

11. The Viterbi decoder of claim 10 wherein said comparing means includes a delay means for delaying said early decision output to provide said early decision output.

12. The Viterbi decoder of claim 10 further comprising holding means for receiving said signal.

13. The Viterbi decoder of claim 12 further comprising:
    reconstruction filter and error signal generating means for generating error signals,
    wherein said holding means disables said error signals until said early decision output with errors passes out of said reconstruction filter and error signal generating means.

14. The Viterbi decoder of claim 10 wherein said secondary early decision output includes at least one bit that is temporally closer to a full decision output than said early decision output.

15. A Viterbi decoder comprising:
    early decision generating means for generating an early decision output;
    secondary early decision generating means for generating a secondary early decision output;
    flag generating means for generating a best path flag when said Viterbi decoder identifies two best paths having the same path metric; and
    error detecting means for detecting errors in said early decision output and that includes comparing means for generating a signal when a prior secondary early decision output is different than said early decision output, said best path flag is true and a prior best path flag is true.

16. The Viterbi decoder of claim 15 further comprising:
    reconstruction filter and error signal generating means for communicating with said Viterbi decoder and for generating error signals; and
    holding means for communicating with said error detecting means and for holding said signal until said early decision output with errors passes out of said reconstruction filter and error signal generating means.

* * * * *